United States Patent [19]

Baum

[11] Patent Number: 5,027,081
[45] Date of Patent: Jun. 25, 1991

[54] HIGH GAIN DIFFERENTIAL-TO-SINGLE ENDED AMPLIFIER HAVING A TEE NETWORK FEEDBACK LOOP

[75] Inventor: Jeffery I. Baum, Scottsdale, Ariz.
[73] Assignee: Motorola, Inc., Schaumburg, Ill.
[21] Appl. No.: 518,627
[22] Filed: May 3, 1990
[51] Int. Cl.⁵ .............................................. H03F 1/34
[52] U.S. Cl. ........................................ 330/84; 73/727; 330/147; 330/69
[58] Field of Search ................. 330/69, 84, 147, 275, 330/301; 73/720, 721, 726, 727

[56] References Cited

U.S. PATENT DOCUMENTS 4,595,884  6/1986  Miller, Jr. .................... 330/146 X
4,714,067 12/1987  Staerzl ............................... 123/494

OTHER PUBLICATIONS

Weatherway, "A Solid-State Barometer" Sen Sym Inc. (1987) pp. 7-71 and 7-58.
Wait et al., "Introduction to Operational Amplifier Theory and Applications" Dept. of Engag U. of Arizona, ©1975 McGraw Hill Preface pp. XI-XIV An Main Text Pages.

*Primary Examiner*—James B. Mullins
*Attorney, Agent, or Firm*—Joe E. Barbee; Robert M. Handy

[57] ABSTRACT

An amplifier stage includes an operational amplifier having inverting and non-inverting inputs and an output and a resistive tee network coupled in the feedback loop between the inverting input and output to the non-inverting input which network is reference to the voltage applied at the non-inverting input for setting the gain of the amplifier stage. The amplifier stage may be combined with a differential pressure sensor for providing a single ended output voltage in response to the differential voltage outputs of the pressure sensor being applied to the inverting and non-inverting inputs of the amplifier stage.

7 Claims, 1 Drawing Sheet

HIGH GAIN DIFFERENTIAL-TO-SINGLE ENDED AMPLIFIER HAVING A TEE NETWORK FEEDBACK LOOP

BACKGROUND OF THE INVENTION

The present invention relates to inverting operational amplifiers utilizing short-circuit transfer impedance in the feedback loop thereof for setting the gain of the amplifiers and, more particularly, to a differential to single ended operational amplifier utilizing a resistive tee network in the feedback loop that is referenced to the input for setting the gain of the amplifier.

There are a myriad of applications for high gain differential-to-single ended amplifier circuits. For instance, such an amplifier circuit is needed for use with standard pressure sensors that are required for very low pressure applications. Typical silicon piezoresistive pressure sensors commercially available may not be able to provide useable output voltages at very low applied pressures. An example is the MPX 2010 pressure sensor manufactured by Motorla, Inc. Although this pressure sensor works quite well it only has a sensitivity of approximately 2.5 mV/kPa. Hence, for very low pressures the differential output of the sensor must be grealty amplified.

One method to provide a large gain factor is the use of operational amplifiers having a feedback loop for controlling the gain of the amplifier. If the amplifier is to be utilized in combination with monolithic circuit applications it is desirable that resistive feedback elements be used that can be trimmed in commercial manufacture of these amplifiers. The use of a resistive tee network referenced to ground in the feedback loop of a single ended input and output amplifier is known. However, this known amplifier circuit is not suited for use for differential inputs.

Hence, a need exists for providing a high gain differential-to-single ended amplifier circuit having a resistive network in the feedback loop of the amplifier that is referenced to the applied input while providing a known output offset with zero input thereto.

SUMMARY OF THE INVENTION

Accordingly, it is an object if the present invention to provide an improved high gain amplifier.

It is another object of the present invention to provide an improved differential-to-single ended amplifier.

Still another object of the present invention is to provide an improved high gain amplifier including a resistive tee feedback loop that is referenced to the input to the amplifier.

Yet another object of the present invention is to provide a high gain amplifier for use with a pressure sensor.

In accordance with the above and other objects there is provided an amplifier stage comprised of operational amplifier having inverting and non-inverting inputs and an output and a resistive tee network coupled in the feedback loop between the inverting input and output to the non-inverting input which network is referenced to the voltage applied at the non-inverting input for setting the gain of the amplifier stage.

DETAILED DESCRIPTION OF THE PREFERRED EMBODIMENT

Figure 1:
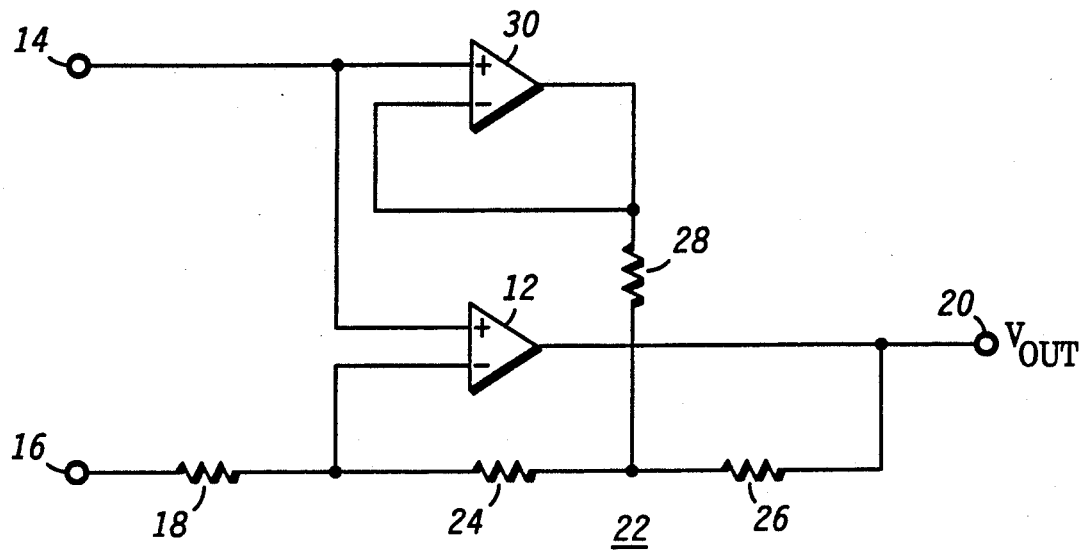
FIG. 1 is a schematic diagram illustrating the amplifier stage of the present invention.

Turning to FIG. 1 there is shown differential-to-single ended amplifier stage 10 of the present invention. Amplifier stage 10 includes operational amplifier 12 having non-inverting and inverting inputs coupled respectively to inputs 14 and 16 (via resistor 18) to which may be applied a differential voltage input signal and an output 20 at which is provided a single ended output voltage Vout. A three port network comprising resistive tee network 22 is used to provide a short circuit transfer impedance in the feedback loop of the amplifier stage. The tee configuration consisting of resistors 24 and 26 and coupled between the inverting input and output of amplifier 12 and resistor 28 (the tee element) coupled between the interconnection of resistors 24 and 26 and the output of operational amplifier 30 can be used to obtain the short circuit transfer resistance that is considerably larger than the individual resistances. Operational amplifier 30 is connected as a unity gain or buffer amplifier such that the output thereof, which is connected to one end of the resistor 28, is referenced to the input signal appearing at input 14. Thus, the resistor tee network is referenced to the input signal that appears at input 14.

In operation, amplifier stage 10 converts a differential input signal applied across inputs 14 and 16 to a single-ended output voltage, Vout. The gain of stage 10 is determined by the value of resistor 28, $R_{28}$, since the current through the resistor is determined by the voltage drop thereacross, the latter of which is a function of the input voltage appearing at input 14 and applied at the output of amplifier 30.

For a desired gain of stage 10 the resistance value $R_{28}$ can be calculated from the following emperically derived formula:

$$R_{28} = [7.3 \times 10^4 / G]^{1.07}, \qquad (1)$$

where G is the desired gain. This assumes that the resistive value of resistor 18 is approximately 1 kΩ, and the value of resistors 24 and 26 is 10 kΩ.

Figure 2:
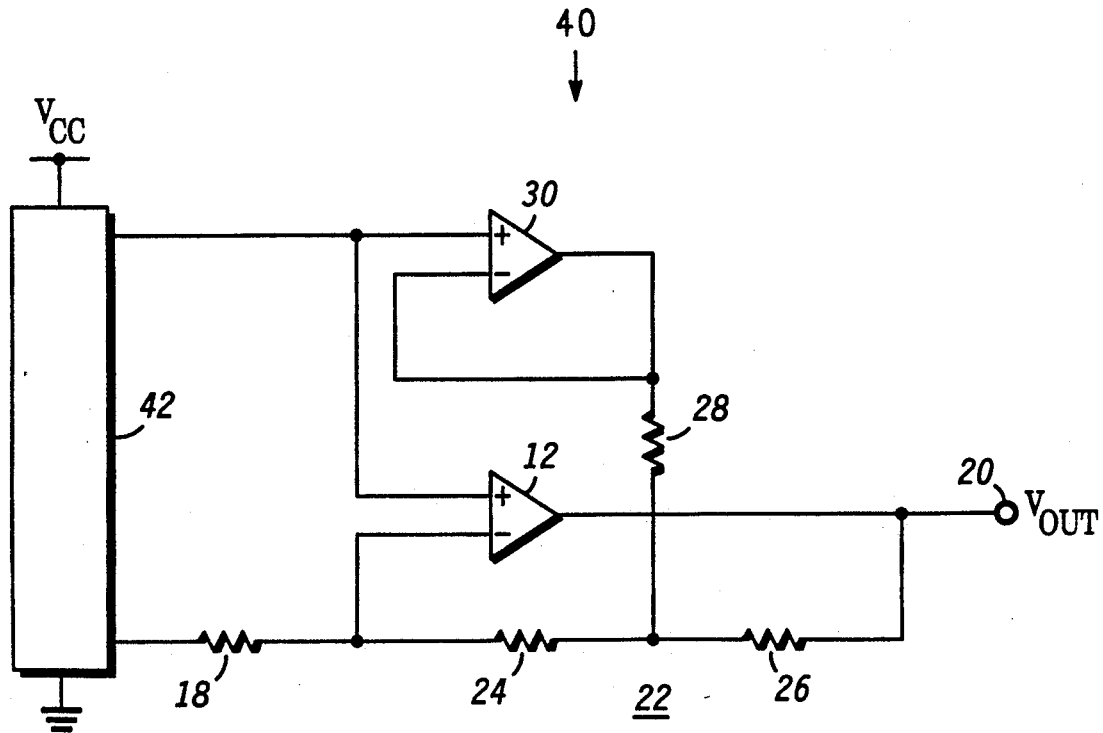
FIG. 2 illustrates the combination of the invention of FIG. 1 with a pressure sensor.

Turning now to FIG. 2 there is shown an application of the high gain amplifier stage 10 for use with conventional differential pressure sensors to provide a single-ended output voltage in response to very small differential pressures applied to the pressure sensors. It is understood that components of FIG. 2 corresponding to like components of FIG. 1 are designated with the same reference numerals. The differential inputs of amplifier stage 10 of sensor circuit 40 are adapted to be coupled to the differential outputs of pressure sensor 42, the latter of which is coupled between Vcc and ground reference. An example of a commercially available pressure sensor of the type designated by reference number 42 is the MPX 2010 Differential Pressure Sensor manufactured by Motorola, Inc. In this case, the +Vout pin of the pressure sensor is coupled to the inverting input of amplifier stage 10 while the −Vout pin is coupled to non-inverting input.

In most pressure sensor applications it is desired to provide a known offset output voltage at terminal 20 with zero pressure offset. The use of amplifier stage 10 provides the necessary offset output voltage which can be adjusted internally to pressure sensor 42 by laser trimming resistive components thereof as is understood. Thus, once the gain of amplifier stage 10 is set by selecting an appropriate value of resistor 28; the differential input signal applied to the amplifier stage can be adjusted to set the desired offset output voltage.

Hence, what has been described above is a novel high gain differential-to-single ended amplifier stage comprising a conventional inverting operational amplifier and a resistive tee network coupled in the feedback loop wherein the "T" resistive element is referenced to the input signal applied to the non-inverting input of the operational amplifier. The gain of the amplifier stage is mainly determined by the tee resistive element. The amplifier stage may be used in combination with a differential pressure sensor to provide sufficient gain to measure very low pressures. An advantage of the pressure sensing system is that the values of the resistors of the tee network can be sized to be integratable on the pressure sensor chip while providing sufficient gain. in addition, internal trim resistors typically used in commercial pressure sensors can be utilized to adjust the zero pressure offset output voltage of the amplifier stage once the gain has been determined.

What is claimed is:

1. A differential-to-single ended amplifier stage, comprising:
    an amplifier having inverting and non-inverting inputs and an output; and
    a feedback loop including a three port network for providing a short circuit transfer impedance and setting the gain of the amplifier stage wherein said three port network is referenced to the input signal appearing at said non-inverting input of said amplifier, and wherein electrical continuity exists within said three port network from any one port to any other port without intersecting a further port of the three port network.

2. The amplifier stage of claim 1 wherein said feedback loop includes a unity gain buffer means coupled between said non-inverting input of said amplifier and said three port network.

3. A differential-to-single ended amplifier stage, comprising:
    an amplifier having inverting and non-inverting inputs and an output; and
    a feedback loop including a three port network for providing a short circuit transfer impedance and setting the gain of the amplifier stage wherein said three port network is referenced to the input signal appearing at said non-inverting input of said amplifier, and including a unity gain buffer coupled between said non-inverting input of said amplifier and said three port network, wherein said three port network includes first, second and third resistors each of which have a first end commonly connected together, the second end of said first resistor being coupled to the said inverting input of said amplifier, the second end of said second resistor being coupled to said output of said amplifier and the second end of said third resistor being coupled to said unity gain buffer means.

4. The amplifier stage of claim 3 including a fourth resistor coupled between an input terminal and said inverting input of said amplifier.

5. The amplifier stage of claim 3 wherein said inverting and non-inverting inputs of said amplifier are coupled to respective outputs of a differential pressure sensor for providing a single ended output voltage responsive to a differential pressure being applied to said sensor.

6. A system for providing an output voltage responsive to an applied differential pressure, comprising:
    a differential pressure sensor responsive to the differential pressure for providing a differential output voltage at first and second outputs;
    a first differential to single ended amplifier having inverting and non-inverting inputs coupled respectively to said first and second outputs of said differential pressure sensor and an output; and
    a feedback loop including a three port network for providing a short circuit transfer impedance and setting the gain of said first amplifier wherein said network is referenced to the output voltage of said pressure sensor applied at said non-inverting input of said first amplifier, and wherein electrical continuity exists within said three port network from any one port to any other port without intersecting a further port of the three port network.

7. A system for providing an output voltage responsive to an applied differential pressure, comprising:
    a differential pressure sensor responsive to the differential pressure for providing a differential output voltage at first and second outputs;
    a first differential to single ended amplifier having inverting and non-inverting inputs coupled respectively to said first and second outputs of said differential pressure sensor and an output; and
    a feedback loop including a three port network for providing a short circuit transfer impedance and setting the gain of said first amplifier wherein said network is referenced to the output voltage of said pressure sensor applied at said non-inverting input of said first amplifier; and
    wherein said feedback loop includes:
    a second unity gain buffer amplifier having an input coupled to said non-inverting input of said first amplifier and an output; and
    said three port network includes first, second and third resistors each having first and second ends, said first ends being commonly connected, said second end of said first resistor being coupled to said inverting input of said first amplifier, said second end of said resistor being coupled to said output of said first amplifier and said second end of said third resistor being coupled to said output of said second amplifier.

* * * * *